United States Patent
Shon et al.

(10) Patent No.: US 10,964,364 B2
(45) Date of Patent: Mar. 30, 2021

(54) SEMICONDUCTOR DEVICE AND SEMICONDUCTOR SYSTEM INCLUDING THE SAME

(71) Applicant: SK hynix Inc., Icheon-si (KR)

(72) Inventors: Kwan Su Shon, Guri-si Gyeonggi-do (KR); Yo Han Jeong, Seongnam-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/806,822

(22) Filed: Mar. 2, 2020

(65) Prior Publication Data

US 2021/0057006 A1    Feb. 25, 2021

(30) Foreign Application Priority Data

Aug. 21, 2019  (KR) .................. 10-2019-0102607

(51) Int. Cl.
  *G11C 7/22* (2006.01)
  *G11C 7/10* (2006.01)
  *G11C 5/02* (2006.01)

(52) U.S. Cl.
  CPC .............. *G11C 7/222* (2013.01); *G11C 5/025* (2013.01); *G11C 7/1084* (2013.01)

(58) Field of Classification Search
  CPC ....... G11C 7/222; G11C 7/1084; G11C 5/025; G11C 11/4076; G11C 7/109
  See application file for complete search history.

(56) References Cited

U.S. PATENT DOCUMENTS

| | | | |
|---|---|---|---|
| 8,344,754 B2 | 1/2013 | Kim et al. | |
| 2011/0087811 A1 | 4/2011 | Kondo et al. | |
| 2016/0196857 A1* | 7/2016 | Lee ................. | G11C 8/18 |
| | | | 365/189.02 |

FOREIGN PATENT DOCUMENTS

KR    1020110128047 A    11/2011

* cited by examiner

*Primary Examiner* — David Lam
(74) *Attorney, Agent, or Firm* — William Park & Associates Ltd.

(57) ABSTRACT

A semiconductor device includes a plurality of stacked dies electrically connected with each other. Each of the stacked dies includes a data path, a strobe path, a stack information generation circuit, and a delay control circuit. The data path transmits a data signal. The strobe path transmits a data strobe signal. The stack information generation circuit generates stack information representing a number of the dies. The delay control circuit controls a delay time of at least one of the data path and the strobe path based on the stack information.

19 Claims, 7 Drawing Sheets

| INF_STK<1:0> | Stack | DCTR_DQ<2:0> | DCTR_DQS<2:0> |
|---|---|---|---|
| 00 | 1-die/ch. | 111 | 000 |
| 01 | 2-die/ch. | 110 | 001 |
| 10 | 4-die/ch. | 100 | 011 |
| 11 | 8-die/ch. | 000 | 111 |

SEMICONDUCTOR DEVICE AND SEMICONDUCTOR SYSTEM INCLUDING THE SAME

CROSS-REFERENCES TO RELATED APPLICATION

The present application claims priority under 35 U.S.C. § 119(a) to Korean application number 10-2019-0102607, filed on Aug. 21, 2019, in the Korean Intellectual Property Office, which is incorporated herein by reference in its entirety.

BACKGROUND

1. Technical Field

Various embodiments may generally relate to a semiconductor circuit, and more particularly, to a semiconductor device and a semiconductor system including the same.

2. Related Art

A semiconductor device may include a plurality of stacked dies (chips).

An external device, for example, a memory controller, may provide the semiconductor device with data and a data strobe signal for notifying a data receiving timing.

The semiconductor device may receive the data and the data strobe signal from the external device. The semiconductor device may latch the received data based on the received data strobe signal. The semiconductor device may process and store the latched data in a memory region.

When the dies are stacked, a signal process loading in the stacked dies may be different from a signal process loading in one die. Thus, timing skew between the data and the data strobe signal for receiving the data may be generated.

Therefore, the semiconductor device might not accurately receive the data due to the timing skew between the data and the data strobe signal.

SUMMARY

In example embodiments of the present disclosure, a semiconductor device includes a plurality of stacked dies electrically connected with each other. Each of the stacked dies includes a data path, a strobe path, a stack information generation circuit, and a delay control circuit. The data path is configured to transmit a data signal. The strobe path is configured to transmit a data strobe signal. The stack information generation circuit is configured to generate stack information for representing a number of the stacked dies. The delay control circuit is configured to control a delay time of at least one of the data path and the strobe path based on the stack information.

In example embodiments of the present disclosure, a semiconductor device includes a plurality of stacked dies electrically connected with each other. Each of the stacked dies includes a data path, a strobe path, a delay control circuit, and a stack information process circuit. The data path is configured to transmit a data signal. The strobe path is configured to transmit a data strobe signal. The delay control circuit is configured to control a delay time of at least one of the data path and the strobe path based on stack information representing a number of the stacked dies. The stack information process circuit is configured to receive the stack information as an address signal and provide the delay control circuit with the stack information.

In example embodiments of the present disclosure, a semiconductor system includes a semiconductor device and a controller. The semiconductor device includes a plurality of dies electrically connected with each other. Each of the dies is configured to control a delay time of a data path for transmitting a data signal and a strobe path for transmitting a data strobe signal based on stack information representing a number of the stacked dies. The controller is configured to provide the semiconductor device with the stack information.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present teachings are described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, described embodiments of the present teachings should not be construed as limiting the inventive concept. Although a few embodiments of the present teachings will be shown and described, it will be appreciated by those of ordinary skill in the art that changes may be made in these embodiments without departing from the principles and spirit of the present teachings.

Various embodiments provide a semiconductor device capable of accurately receiving data regardless of a number of stacked dies. Some embodiments also provide a semiconductor system including the semiconductor device indicated above. According to example embodiments, the semiconductor device may accurately receive the data at a set timing regardless of the number of stacked dies so that capacities of the semiconductor device and the semiconductor system including the semiconductor device may be improved.

Figure 1:
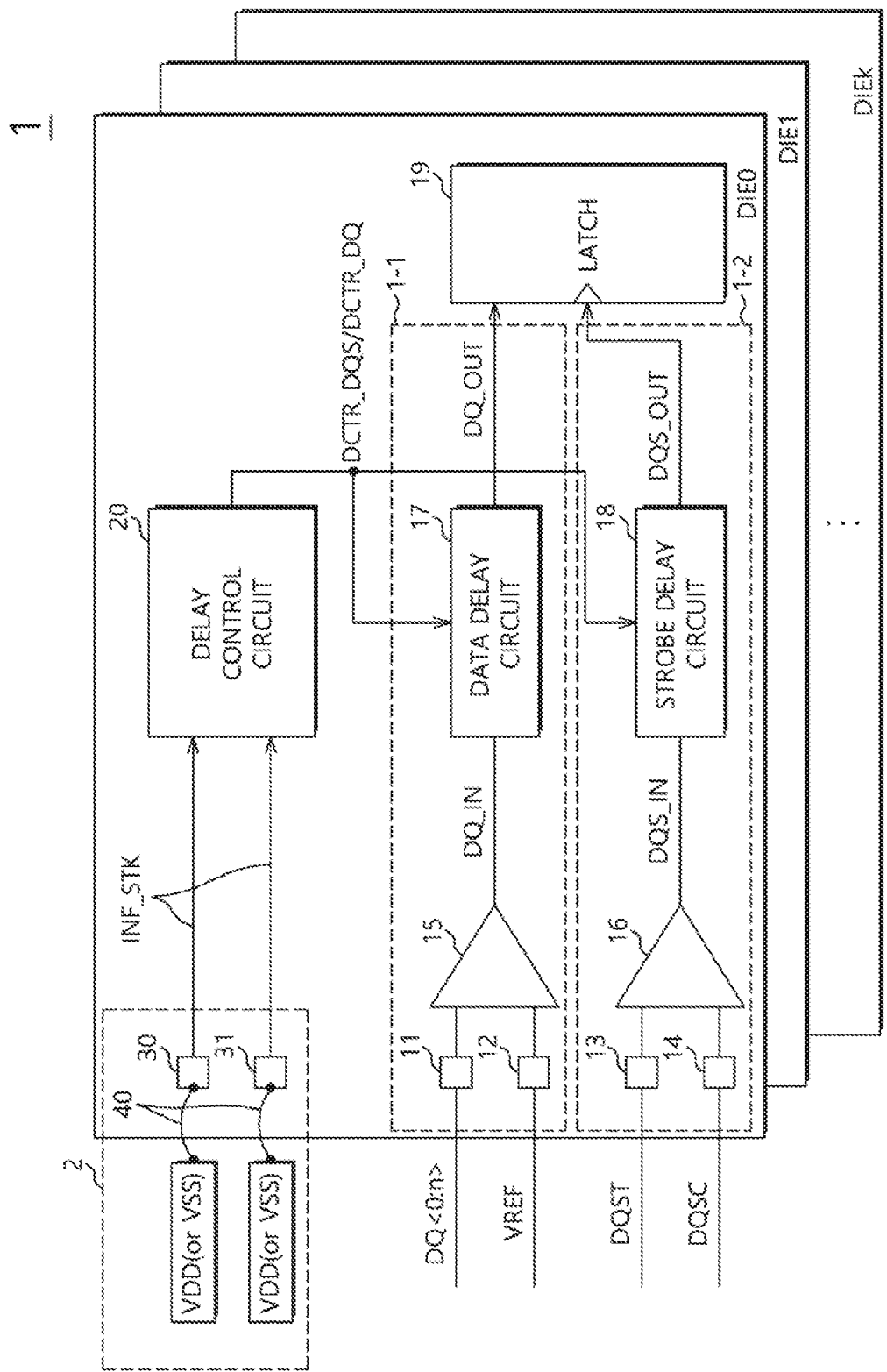
FIG. 1 is a view illustrating a semiconductor device in accordance with an embodiment.

FIG. 1 is a view illustrating a semiconductor device 1 in accordance with some embodiments.

Referring to FIG. 1, the semiconductor device 1 may include a plurality of dies DIE<0:k> (DIE0-DIEk).

The dies DIE<0:k> may be stacked. The dies DIE<0:k> may be electrically connected with each other. The dies DIE<0:k> may have substantially the same configuration. Thus, hereinafter, the configuration of one die DIE0 is illustrated.

The die DIE0 may include a plurality of pads 11, 12, 13, 14, 30, and 31, a stack information generation circuit 2, a first input buffer 15, a second input buffer 16, a data delay circuit 17, a strobe delay circuit 18, a latch 19, and a delay control circuit 20.

DQ pads, for example, the first pads 11 among the pads 11, 12, 13, 14, 30, and 31 may receive data signals DQ<0:n>.

The first pads 11 may correspond to bits of the data signals DQ<0:n>, respectively. FIG. 1 as illustrated shows one pad representing the first pads 11 for convenience.

A reference voltage pad, for example, a second pad 12 may receive a reference voltage VREF.

A third pad 13 of DQS pads 13 and 14 may receive any one of differential data strobe signals DQST and DQSC, for example, the differential data strobe signal DQST. A fourth pad 14 may receive any one of differential data strobe signals DQST and DQSC, for example, the differential data strobe signal DQSC.

The stack information generation circuit 2 may generate stack information INF_STK representing a number of the stacked dies DIE<0:k>. That is, for some embodiments, the stack information includes an indication of the number of stacked dies.

The stack information generation circuit 2 may use a logic level of at least one among the pads 11, 12, 13, 14, 30, and 31, for example, logic levels of the fifth pad 30 and the sixth pad 31 as the stack information INF_STK.

Spare pads of the pads in the semiconductor device may be used for the fifth pad 30 and the sixth pad 31.

For example, the stack information with respect to a 1-die package, 2-die package, 4-die package, and 8-die package may have '00', '01', '10', and '11'.

Therefore, when manufacturing a semiconductor package including a semiconductor device according to an embodiment, a power voltage VDD or a ground voltage VSS may be selectively applied to the fifth pad 30 and the sixth pad 31 to set the stack information INF_STK corresponding to a number of the stacked dies.

The fifth pad 30 and the sixth pad 31 may be electrically connected with a power voltage VDD terminal or a ground voltage VSS terminal through a bonding wire 40.

For example, in the 1-die package, the ground voltage VSS terminal may be bonded to the fifth pad 30 and the sixth pad 31.

Alternatively, in the 4-die package, the power voltage VSS terminal may be bonded to the fifth pad 30 and the ground voltage VSS terminal may be bonded to the sixth pad 31.

In the 8-die package, the power voltage VDD terminal may be bonded to the fifth pad 30 and the sixth pad 31.

FIG. 1 shows the stack information generation circuit 2 using the logic levels of the fifth pad 30 and the sixth pad 31 as the stack information INF_STK. Thus, the stack information generation circuit 2 may use a fuse set programmed based on the values of the stack information INF_STK instead of using the logic levels of the fifth pad 30 and the sixth pad 31 as the stack information INF_STK.

The first input buffer 15 may receive the data signals DQ<0:n> based on the reference voltage VREF, to generate an internal data signal DQ_IN.

The second input buffer 16 may receive the differential data strobe signal DQST based on the differential data strobe signal DQSC, to generate an internal strobe signal DQS_IN.

The data delay circuit 17 may delay the internal data signal DQ_IN by a time changed based on a first delay control code DCTR_DQ to generate a timing-compensated data signal DQ_OUT having a compensated timing.

The strobe delay circuit 18 may delay the internal strobe signal DQS_IN by a time changed based on a second delay control code DCTR_DQS to generate a timing-compensated strobe signal DQS_OUT.

The latch 19 may latch the timing-compensated data signal DQ_OUT based on the timing-compensated strobe signal DQS_OUT.

The timing-compensated data signal DQ_OUT latched by the latch 19 may be stored in a memory region through signal paths.

The delay control circuit 20 may generate the first delay control code DCTR_DQ and the second delay control code DCTR_DQS based on the stack information INF_STK.

A path of the data signal DQ provided from an external device, i.e., a signal path from the first and second pads 11 and 12 to the latch 19 through the first input buffer 15 and the data delay circuit 17 may be referred to as a data path (1-1).

A path of the strobe signal DQS provided from an external device, i.e., a signal path from the third and fourth pads 13 and 14 to the latch 19 through the second input buffer 16 and the strobe delay circuit 18 may be referred to as a strobe path (1-2).

Figure 2:
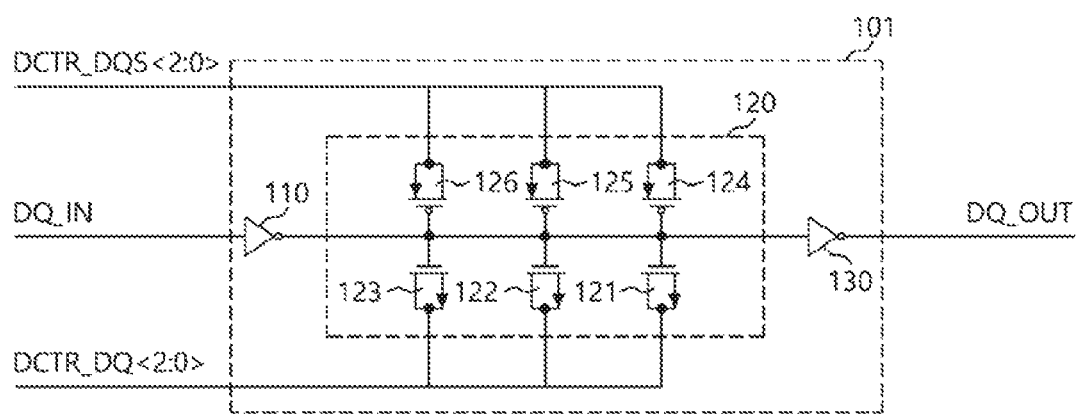
FIG. 2 is a view illustrating a data delay circuit in FIG. 1 in accordance with an embodiment.

FIG. 2 is a view illustrating the data delay circuit 17 in FIG. 1 in accordance with an embodiment.

Referring to FIG. 2, the data delay circuit 17 may include a variable delay circuit 101.

The variable delay circuit 101 may include a plurality of inverters 110 and 130 and a variable delay component 120.

The first inverter 110 may invert the internal data signal DQ_IN.

The second inverter 130 may invert an output signal from the variable delay component 120 to output the timing-compensated data signal DQ_OUT.

The variable delay component 120 may include a plurality of switching capacitors 121-126.

The switching capacitors 121-126 may include transistors. The transistors may have different capacitances by differentiating a ratio between a width and a length of the transistor in a binary weighted manner.

A first switching capacitor group 121-123 among the switching capacitors 121-126 may be capacitors formed using NMOS transistors. The capacitances of the capacitors in the first switching capacitor group 121-123 may be increased or decreased based on a value of the first delay control code DCTR_DQ, for example, three bits of a first delay control code DCTR_DQ<2:0>.

The capacitance of the first switching capacitor group 121-123 may be increased in proportion to increasing of the value of the first delay control code DCTR_DQ<2:0>, for example, a decimal value of the first delay control code DCTR_DQ<2:0> to increase a delay time of an output signal from the first inverter 110.

The capacitance of the first switching capacitor group 121-123 may be decreased in proportion to decreasing of the value of the first delay control code DCTR_DQ<2:0>, for example, a decimal value of the first delay control code DCTR_DQ<2:0> to decrease the delay time of the output signal from the first inverter 110.

A second switching capacitor group 124-126 among the switching capacitors 121-126 may be capacitors formed using PMOS transistors. The capacitances of the capacitors in the second switching capacitor group 124-126 may be increased or decreased based on a value of the second delay control code DCTR_DQS, for example, three bits of a second delay control code DCTR_DQS<2:0>.

The capacitance of the second switching capacitor group 124-126 may be increased in proportion to decreasing of the value of the second delay control code DCTR_DQS<2:0> to increase the delay time of the output signal from the first inverter 110.

The capacitance of the second switching capacitor group 124-126 may be decreased in proportion to increasing of the value of the second delay control code DCTR_DQS<2:0> to decrease the delay time of the output signal from the first inverter 110.

Therefore, the capacitances of the switching capacitors 121-126 may be increased or decreased based on the first delay control code DCTR_DQ<2:0> and the second delay control code DCTR_DQS<2:0> to control the delay time of the data delay circuit 17.

Figure 3:
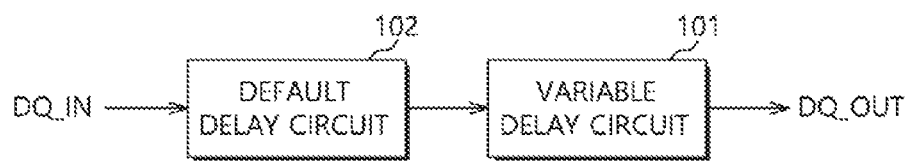
FIG. 3 is a view illustrating a data delay circuit in FIG. 1 in accordance with an embodiment.

FIG. 3 is a view illustrating the data delay circuit 17 in FIG. 1 in accordance with an embodiment.

Referring to FIG. 3, the data delay circuit 17 may include the variable delay circuit 101 of FIG. 2 and a default delay circuit 102.

The default delay circuit 102 may delay the internal data signal DQ_IN by a set time, fiducially a single die to control a timing difference between the internal data signal DQ_IN and the internal strobe signal DQS_IN.

Figure 4:
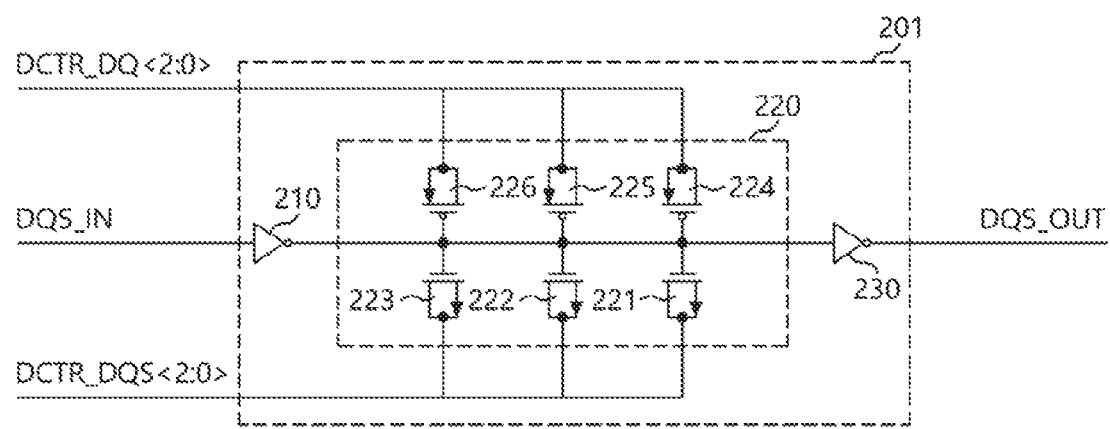
FIG. 4 is a view illustrating a strobe delay circuit in FIG. 1 in accordance with an embodiment.

FIG. 4 is a view illustrating the strobe delay circuit 18 in FIG. 1 in accordance with an embodiment.

Referring to FIG. 4, the strobe delay circuit 18 may include a variable delay circuit 201.

The variable delay circuit 201 may include a plurality of inverters 210 and 230 and a variable delay component 220.

The first inverter 210 may invert the internal strobe signal DQS_IN.

The second inverter 230 may invert an output signal from the variable delay component 220 to output the timing-compensated strobe signal DQS_OUT.

The variable delay component 220 may include a plurality of switching capacitors 221-226.

The switching capacitors 221-226 may include transistors. The transistors may have different capacitances by differentiating a ratio between a width and a length of the transistor in a binary weighted manner.

A first switching capacitor group 221-223 among the switching capacitors 221-226 may be capacitors formed using NMOS transistors. The capacitances of the capacitors in the first switching capacitor group 221-223 may be increased or decreased based on the second delay control code DCTR_DQS<2:0>.

The capacitance of the first switching capacitor group 221-223 may be increased in proportion to increasing of a value of the second delay control code DCTR_DQS<2:0> to increase a delay time of an output signal from the first inverter 210.

The capacitance of the first switching capacitor group 221-223 may be decreased in proportion to decreasing of the value of the second delay control code DCTR_DQS<2:0> to decrease the delay time of the output signal from the first inverter 210.

A second switching capacitor group 224-226 among the switching capacitors 221-226 may be capacitors formed using PMOS transistors. The capacitances of the capacitors in the second switching capacitor group 224-226 may be increased or decreased based on the first delay control code DCTR_DQ<2:0>.

The capacitance of the second switching capacitor group 224-226 may be increased in proportion to decreasing of the value of the first delay control code DCTR_DQ<2:0> to increase the delay time of the output signal from the first inverter 210.

The capacitance of the second switching capacitor group 224-226 may be decreased in proportion to increasing the value of the first delay control code DCTR_DQ<2:0> to decrease the delay time of the output signal from the first inverter 210.

Therefore, the capacitances of the switching capacitors 221-226 may be increased or decreased based on the first delay control code DCTR_DQ<2:0> and the second delay control code DCTR_DQS<2:0> to control the delay time of the strobe delay circuit 18.

In the strobe delay circuit 18, the second delay control code DCTR_DQS<2:0> may be inputted into the first switching capacitor group 221-223 and the first delay control code DCTR_DQ<2:0> may be inputted into the second switching capacitor group 224-226. Thus, the delay time of the strobe delay circuit 18 may be inversely proportional to the delay time of the data delay circuit 17.

Figure 5:
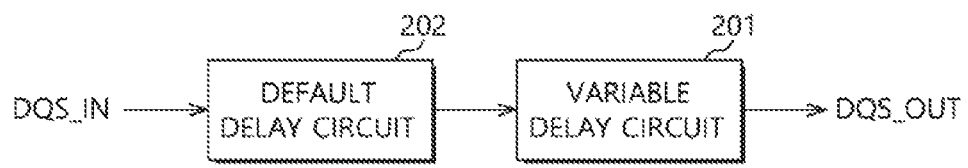
FIG. 5 is a view illustrating a strobe delay circuit in FIG. 1 in accordance with an embodiment.

FIG. 5 is a view illustrating the strobe delay circuit 18 in FIG. 1 in accordance with an embodiment.

Referring to FIG. 5, the strobe delay circuit 18 may include the variable delay circuit 201 of FIG. 4 and a default delay circuit 202.

The default delay circuit 202 may delay the internal strobe signal DQS_IN by a set time, fiducially a single die to control a timing difference between the internal data signal DQ_IN and the internal strobe signal DQS_IN.

Figures 6, 7:
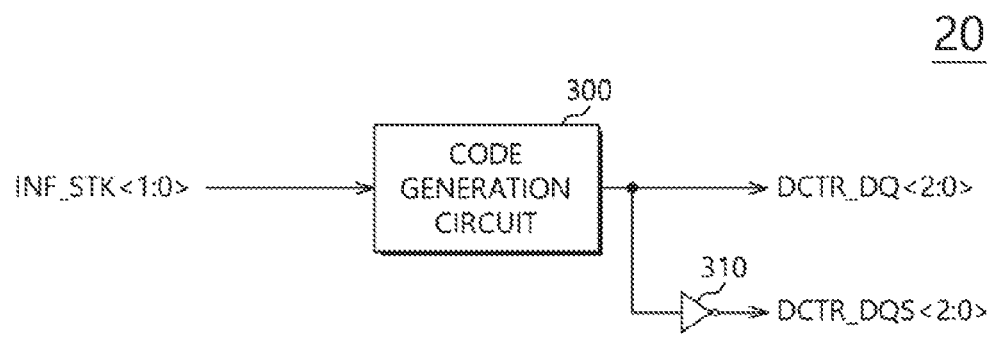
FIG. 6 is a view illustrating a delay control circuit in FIG. 1 in accordance with an embodiment.
FIG. 7 is a code output table of a code generation circuit in FIG. 6 in accordance with an embodiment.

FIG. 6 is a view illustrating the delay control circuit 20 in FIG. 1 in accordance with an embodiment, and FIG. 7 is a code output table of a code generation circuit 300 in FIG. 6.

Referring to FIG. 6, the delay control circuit 20 may include the code generation circuit 300 and an inverter 310.

The code generation circuit 300 may generate a first delay control code DCTR_DQ<2:0> based on the stack information INF_STK, for example, two bits of stack information INF_STK<1:0>. The code generation circuit 300 may include a decoder.

The inverter 310 may invert the first delay control code DCTR_DQ<2:0> to output a second delay control code DCTR_DQS<2:0>.

Referring to FIG. 7, in the 1-die package, the stack information INF_STK<1:0> may have '00'. When the stack information INF_STK<1:0> has '00', the delay control circuit 20 may generate the first delay control code DCTR_DQ<2:0> having '111' and the second delay control code DCTR_DQS<2:0> having '000'.

In the 2-die package, the stack information INF_STK<1:0> may have '01'. When the stack information INF_STK<1:0> has '01', the delay control circuit 20 may generate the first delay control code DCTR_DQ<2:0> having '110' and the second delay control code DCTR_DQS<2:0> having '001'.

In the 4-die package, the stack information INF_STK<1:0> may have '10'. When the stack information INF_STK<1:0> may have '10', the delay control circuit 20 may generate the first delay control code DCTR_DQ<2:0> having '100' and the second delay control code DCTR_DQS<2:0> having '011'.

In the 8-die package, the stack information INF_STK<1:0> may have '11'. When the stack information INF_STK<1:0> may have '11', the delay control circuit 20 may generate the first delay control code DCTR_DQ<2:0> having '000' and the second delay control code DCTR_DQS<2:0> having '111'.

A timing of the internal strobe signal DQS_IN with respect to the internal data signal DQ_IN may be faster in proportion to increasing the number of the stacked dies.

Therefore, when the number of stacked dies is increased, the delay time of the internal data signal DQ_IN may be decreased or the delay time of the internal strobe signal DQS_IN may be increased to reduce a timing difference between the internal data signal DQ_IN and the internal strobe signal DQS_IN.

As shown in FIG. 7, the first delay control code DCTR_DQ<2:0> and the second delay control code DCTR_DQS<2:0> having a logic value opposite to that of the first delay control code DCTR_DQ<2:0> may be generated.

Thus, when the number of stacked dies is increased, the data delay circuit 17 in FIG. 2 may decrease the delay time of the internal data signal DQ_IN, and the strobe delay circuit 18 in FIG. 4 may simultaneously increase the delay time of the internal strobe signal DQS_IN.

In some embodiments, the delay time of the internal data signal DQ_IN may be decreased simultaneously increasing the delay time of the internal strobe signal DQS_IN to more rapidly reduce the timing difference between the internal data signal DQ_IN and the internal strobe signal DQS_ON.

Figure 8:
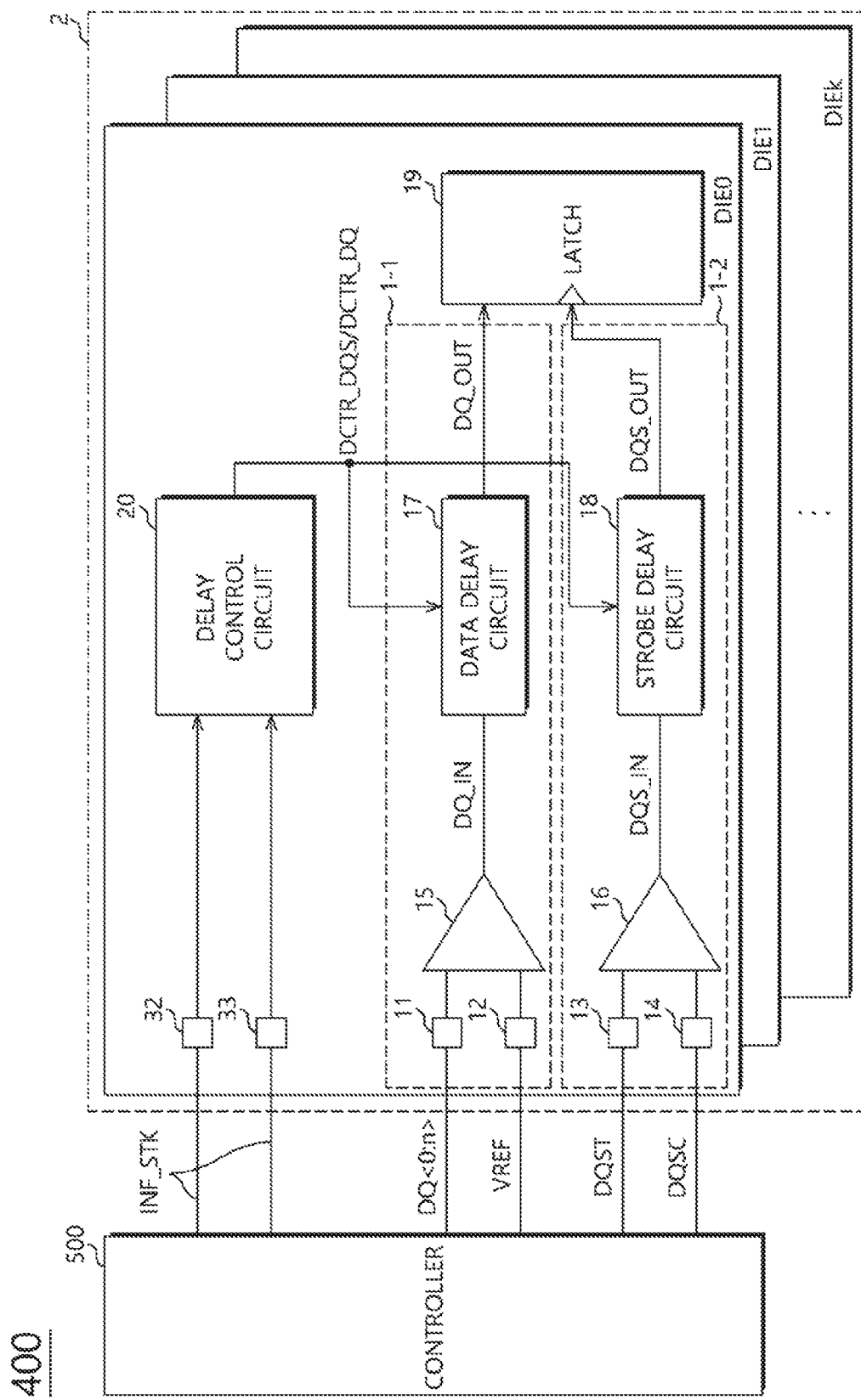
FIG. 8 is a view illustrating a semiconductor system in accordance with an embodiment.

FIG. 8 is a view illustrating a semiconductor system 400 according to some embodiments.

Referring to FIG. 8, the semiconductor system 400 may include a semiconductor device 2 and a controller 500.

The controller 500 may provide the semiconductor device 2 with the data signals DQ<0:n>, the reference voltage VREF, the differential data strobe signals DQST and DQSC, and the stack information INF_STK.

The stack information INF_STK may be set in the controller 500 based on the number of the stacked dies.

The semiconductor device 2 may have a configuration substantially the same as that of the semiconductor device 1 in FIG. 1 except for receiving the stack information INF_STK from the controller 500 through pads 32 and 33.

The pads 32 and 33 may be spare pads of the semiconductor device 2. The spare pads might not be used in a normal mode of the semiconductor device 2.

In some embodiments, the pads 32 and 33 may be used when the stack information INF_STK is two bits. The number of pads configured to receive the stack information INF_STK may be increased or decreased based on the number of bits representing the stack information INF_STK.

Figure 9:
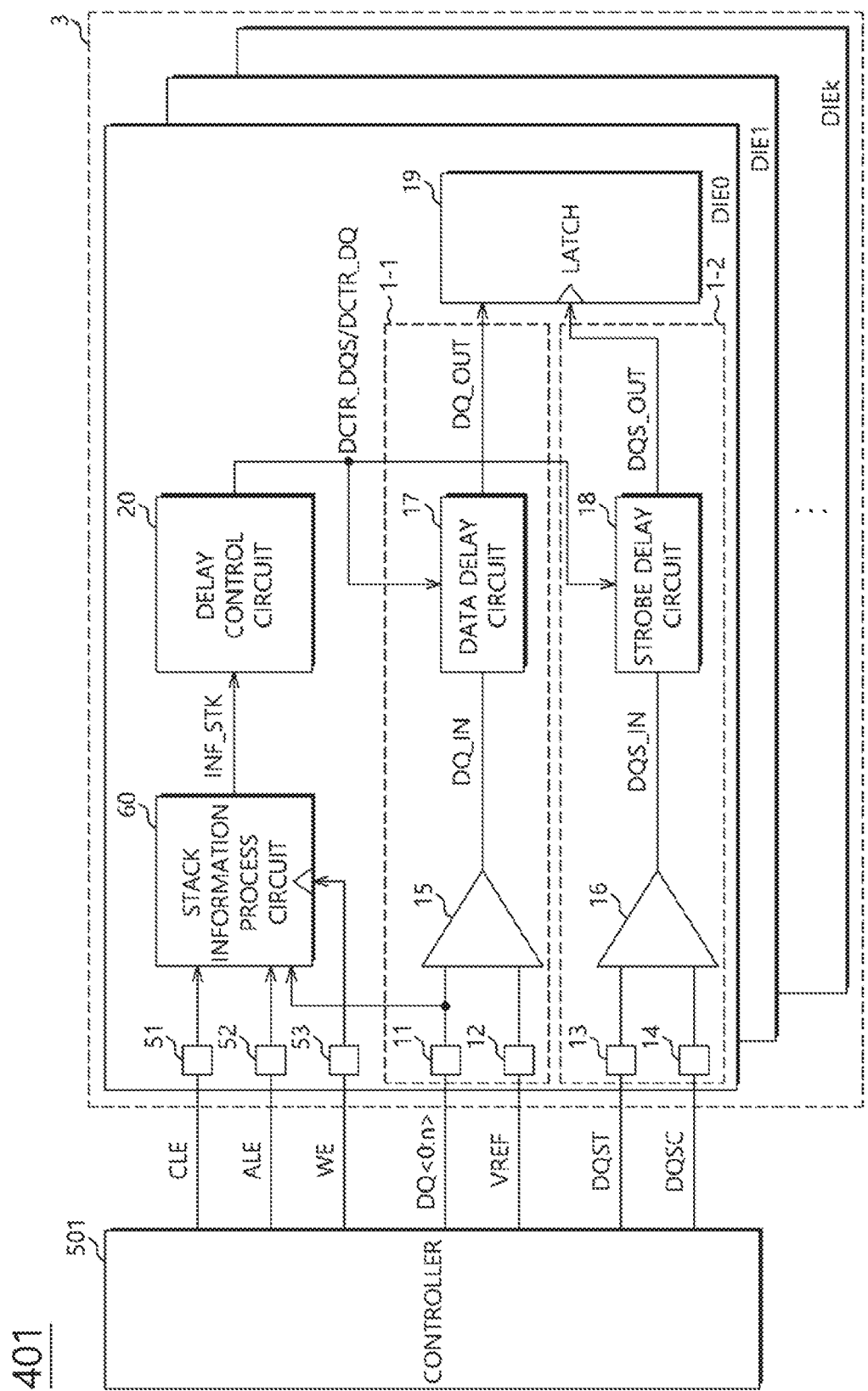
FIG. 9 is a view illustrating a semiconductor system in accordance with an embodiment.

FIG. 9 is a view illustrating a semiconductor system 401 in accordance with some embodiments.

Referring to FIG. 9, the semiconductor system 401 may include a semiconductor device 3 and a controller 501.

The controller 501 may provide the semiconductor device 3 with the data signals DQ<0:n>, the reference voltage VREF, the differential data strobe signals DQST and DQSC, and the stack information INF_STK.

The stack information INF_STK may be set in the controller 501 based on the number of the stacked dies.

The controller 501 may provide the semiconductor device 3 with the stack information INF_STK through pads used in the normal mode of the semiconductor device 3. That is, the pads of some embodiments might not correspond to the spare pads.

The controller 501 may notify the transmission of the stack information INF_STK to the semiconductor device 3 through a stack information write command. The controller 501 may provide the semiconductor device 3 with the stack information INF_STK through an address signal.

The controller 501 may provide the semiconductor device 3 with the stack information write command using a command cycle enable signal CLE and a clock signal WE.

The controller 501 may provide the semiconductor device 3 with the stack information INF_STK provided through the address signal based on an address cycle enable signal ALE and the clock signal WE. The clock signal WE may include a clock signal for the write operation.

The semiconductor device 3 may include the dies DIE<0:k> (DIE0-DIEk). The dies DIE<0:k> may be stacked. The dies DIE<0:k> may be electrically connected with each other. The dies DIE<0:k> may have substantially the same configuration. Thus, hereinafter, the configuration of one die DIE0 is illustrated.

The die DIE0 may include a plurality of pads 11, 12, 13, 14, 51, 52, and 53, a first input buffer 15, a second input buffer 16, a data delay circuit 17, a strobe delay circuit 18, a latch 19, a delay control circuit 20, and a stack information process circuit 60.

The first to fourth pads 11, 12, 13, and 14 among the pads 11, 12, 13, 14, 51, 52, and 53 may be substantially the same as the pads in FIG. 1.

The fifth pad 51, the sixth pad 52, and the seventh pad 53 may be pads for receiving commands. Thus, the fifth to seventh pads 51, 52, and 53 may be referred to as command pads.

The fifth pad 51 may receive the command cycle enable signal CLE.

The sixth pad 52 may receive the address cycle enable signal ALE.

The seventh pad 53 may receive the clock signal WE.

The first input buffer 15, the second input buffer 16, the data delay circuit 17, the strobe delay circuit 18, the latch 19, and the delay control circuit 20 may be substantially the same as those in FIG. 1, respectively.

A path of the data signal DQ provided from an external device, i.e., a signal path from the first and second pads 11 and 12 to the latch 19 through the first input buffer 15 and the data delay circuit 17 may be referred to as a data path (1-1).

A path of the strobe signal DQS provided from an external device, i.e., a signal path from the third and fourth pads 13 and 14 to the latch 19 through the second input buffer 16 and the strobe delay circuit 18 may be referred to as a strobe path (1-2).

The stack information process circuit 60 may recognize a command CMD, i.e., a stack information write command based on the command cycle enable signal CLE fiducially the clock signal WE.

The stack information process circuit 60 may receive the stack information INF_STK provided as the address signal through the first pad 11 based on the address cycle enable signal ALE based on the clock signal WE. The stack information process circuit 60 may provide the delay control circuit 20 with the received stack information INF_STK. The stack information process circuit 60 may include a command decoder.

Figure 10:
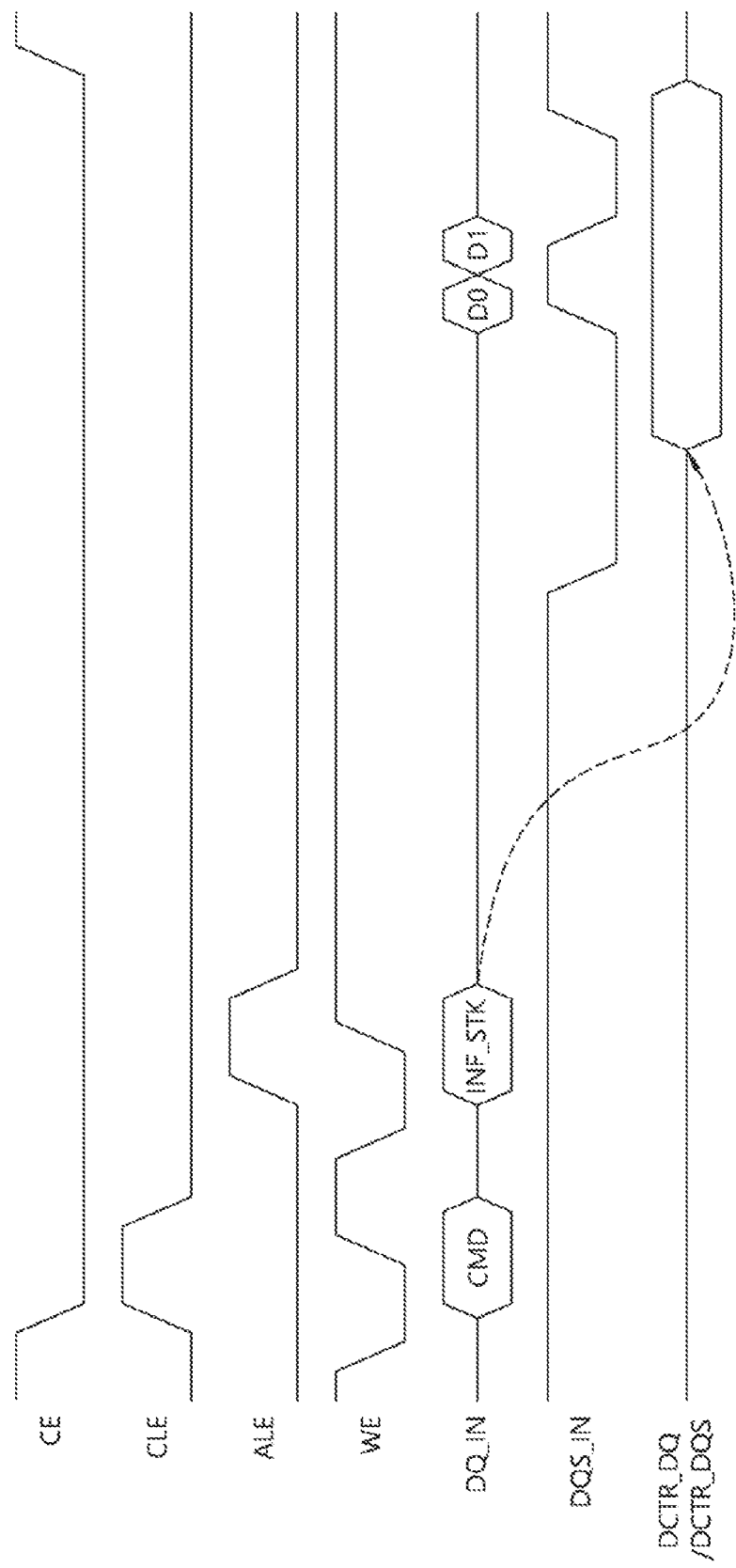
FIG. 10 is a timing chart illustrating timing for a semiconductor system in accordance with an embodiment.

FIG. 10 is a timing chart illustrating timing for the semiconductor system 401 in accordance with an embodiment.

Referring to FIG. 10, the controller 501 may provide the semiconductor device 3 with the clock signal WE.

After a die enable signal CE is transitioned to a low level fiducially the clock signal WE, the controller 501 may generate the command cycle enable signal CLE.

The controller 501 may provide the semiconductor device 3 with the stack information write command through the first pad 11 in a high level section of the command cycle enable signal CLE.

The semiconductor device 3 may recognize the stack information write command to be in a standby mode for transmitting the stack information INF_STK.

The controller 501 may generate the address cycle enable signal ALE based on the clock signal WE.

The controller 501 may provide the semiconductor device 3 with the stack information write command through the first pad 11 in a high level section of the address cycle enable signal ALE.

The semiconductor device 3 may receive the stack information INF_STK to generate the first delay control code DCTR_DQ<2:0> and the second delay control code DCTR_DQS<2:0>.

The semiconductor device 3 may control the delay time of the data delay circuit 17 based on the first delay control code DCTR_DQ<2:0> and the delay time of the strobe delay circuit 18 based on the second delay control code DCTR_DQS<2:0>.

As indicated above, the stack information INF_STK of the semiconductor device 3 may have values corresponding to the number of the stacked dies. Thus, values of the first delay control code DCTR_DQ<2:0> and the second delay control code DCTR_DQS<2:0> may also be changed.

The delay times of the data delay circuit 17 and the strobe delay circuit 18 may also be changed based on the changes of the first delay control code DCTR_DQ<2:0> and the second delay control code DCTR_DQS<2:0>.

After completing the control of the delay times in the first delay control code DCTR_DQ<2:0> and the second delay control code DCTR_DQS<2:0>, the controller 501 may provide the semiconductor device 3 with a write command and data.

The internal strobe signal DQS_IN and the internal data signal DQ_IN may be matched with each other at a desired timing by controlling the delay times of the first delay control code DCTR_DQ<2:0> and the second delay control code DCTR_DQS<2:0>.

Therefore, the internal strobe signal DQS_IN and the internal data signal DQ_IN may be matched with each other at the desired timing so that the internal data signal DQ_IN may be accurately latched with a sufficient margin.

The above-described embodiments of the present teachings are intended to illustrate and not to limit the present teachings. Various alternatives and equivalents are possible. The teachings are not limited by the embodiments described herein. Nor are the present teachings limited to any specific type of semiconductor device. Another additions, subtractions, or modifications are obvious in view of the present disclosure and are intended to fall within the scope of the appended claims.

What is claimed is:

1. A semiconductor device comprising:
   a plurality of stacked dies electrically connected with each other, wherein each of the stacked dies comprises:
   a data path configured to transmit a data signal;
   a strobe path configured to transmit a data strobe signal;
   a stack information generation circuit configured to generate stack information representing a number of the stacked dies; and
   a delay control circuit configured to control a delay time of at least one of the data path and the strobe path based on the stack information.

2. The semiconductor device of claim 1, wherein the stack information generation circuit comprises at least one pad of the semiconductor device.

3. The semiconductor device of claim 2, wherein the at least one pad comprises a pad that is not used in a normal mode of the semiconductor device.

4. The semiconductor device of claim 1, wherein the stack information generation circuit comprises at least one pad of the semiconductor device, wherein the at least one pad is bonded to any one of a power voltage terminal and a ground voltage terminal based on the number of the stacked dies.

5. The semiconductor device of claim 1, wherein the stack information generation circuit comprises a fuse set programmed based on a value of the stack information.

6. The semiconductor device of claim 1, wherein the data path comprises:
   an input buffer configured to receive the data signal to generate an internal data signal; and
   a data delay circuit configured to delay and output the internal data signal by a time changed based on an output from the delay control circuit.

7. The semiconductor device of claim 1, wherein the strobe path comprises:
   an input buffer configured to receive the data strobe signal to generate an internal strobe signal; and
   a strobe delay circuit configured to delay and output the internal strobe signal by a time changed based on an output from the delay control circuit.

8. The semiconductor device of claim 1, wherein the delay control circuit is configured to generate a first delay control code and a second delay control code having a value opposite to that of the first delay control code, and
   the delay control circuit is configured to control the delay times of the data path and the strobe path in an inversely proportional relation using the first and second delay control codes.

9. A semiconductor device comprising:
   a plurality of stacked dies electrically connected with each other, wherein each of the stacked dies comprises:
   a data path configured to transmit a data signal;
   a strobe path configured to transmit a data strobe signal;
   a delay control circuit configured to control a delay time of at least one of the data path and the strobe path based on stack information representing a number of the stacked dies; and
   a stack information process circuit configured to receive the stack information as an address signal and to provide the delay control circuit with the received stack information.

10. The semiconductor device of claim 9, wherein the semiconductor device comprises a plurality of pads,
    the stack information process circuit is configured to recognize a stack information write command based on a command cycle enable signal provided through any one of the plurality of pads, and the stack information process circuit is configured to receive the stack information provided through DQ pads among the plurality of pads based on an address cycle enable signal provided through another pad among the plurality of pads.

11. The semiconductor device of claim 9, wherein the data path comprises:
   an input buffer configured to receive the data signal to generate an internal data signal; and
   a data delay circuit configured to delay and output the internal data signal by a time changed based on an output from the delay control circuit.

12. The semiconductor device of claim 9, wherein the strobe path comprises:
   an input buffer configured to receive the data strobe signal to generate an internal strobe signal; and
      a strobe delay circuit configured to delay and output the internal strobe signal by a time changed based on an output from the delay control circuit.

13. The semiconductor device of claim 9, wherein the delay control circuit is configured to generate a first delay control code and a second delay control code having a value opposite to that of the first delay control code, and
   the delay control circuit is configured to control the delay times of the data path and the strobe path in an inversely proportional relation using the first and second delay control codes.

14. A semiconductor system comprising:
   a semiconductor device including a plurality of stacked dies electrically connected with each other, wherein each of the stacked dies is configured to control a delay time of a data path for transmitting a data signal and a delay time of a strobe path for transmitting a data strobe signal based on stack information representing a number of the stacked dies; and
   a controller configured to provide the semiconductor device with the stack information.

15. The semiconductor system of claim 14, wherein the controller is configured to receive the stack information through spare pads among pads of the semiconductor device.

16. The semiconductor system of claim 14, wherein the semiconductor device comprises a delay control circuit configured to control the delay time of at least one of the data path and the strobe path based on the stack information.

17. The semiconductor system of claim 14, wherein the controller is configured to provide the semiconductor device with the stack information as an address signal based on a stack information write command.

18. The semiconductor system of claim 17, wherein the semiconductor device comprises:
   a delay control circuit configured to control the delay time of at least one of the data path and the strobe path based on the stack information; and
   a stack information process circuit configured to receive the stack information as the address signal and to provide the delay control circuit with the received stack information.

19. The semiconductor system of claim 18, wherein the stack information process circuit is configured to recognize the stack information write command based on a command cycle enable signal provided through any one of the pads, and
   the stack information process circuit is configured to receive the stack information provided through DQ pads among the pads based on an address cycle enable signal provided through another pad among the pads.

* * * * *